United States Patent
Latu et al.

(10) Patent No.: US 6,757,386 B1
(45) Date of Patent: Jun. 29, 2004

(54) APPARATUS, SYSTEM, AND METHOD FOR EFFICIENT REDUCTION OF ELECTROMAGNETIC INTERFERENCE IN TELECOMMUNICATIONS EQUIPMENT

(75) Inventors: Jean F. Latu, Sophia-Antipolis (FR); Wilfrid C. D'Angelo, Sophia-Antipolis (FR); Daniel Jean Pater, Sophia-Antipolis (FR)

(73) Assignee: PCTEL, Inc., Chicago, IL (US)

( * ) Notice: Subject to any disclaimer, the term of this patent is extended or adjusted under 35 U.S.C. 154(b) by 546 days.

(21) Appl. No.: 09/616,579

(22) Filed: Jul. 14, 2000

(51) Int. Cl.[7] .............................................. H04M 17/00
(52) U.S. Cl. ........................ 379/416; 379/414; 333/12
(58) Field of Search ................ 379/399.01, 413.02, 379/413.04, 416; 455/570, 90; 333/222, 181, 12

(56) References Cited

U.S. PATENT DOCUMENTS

| | | | |
|---|---|---|---|
| 4,738,638 A | | 4/1988 | Bogese, II |
| 5,073,924 A | | 12/1991 | Frisby |
| 5,222,076 A | * | 6/1993 | Ng et al. ........................ 375/9 |
| 5,223,806 A | * | 6/1993 | Curtis et al. |
| 5,271,056 A | | 12/1993 | Pesola et al. |
| 5,638,262 A | | 6/1997 | Brown |
| 5,642,416 A | | 6/1997 | Hill et al. |
| 5,671,131 A | | 9/1997 | Brown |
| 5,969,583 A | * | 10/1999 | Hutchison |
| 6,229,442 B1 | * | 5/2001 | Rolin et al. .............. 340/572.1 |

* cited by examiner

*Primary Examiner*—Rexford Barnie
(74) *Attorney, Agent, or Firm*—Farjami & Farjami LLP

(57) ABSTRACT

An apparatus for reducing electromagnetic interference on signals being communicated through one or more communications conductors is disclosed. The apparatus of the present invention is preferably situated in a communications circuit having a first area for receiving one or more communications conductors and an intermediate ground, and a second area having a reference ground. The apparatus includes one or more first capacitors, where each first capacitor is coupled between a communications conductor and the intermediate ground, and a second capacitor coupled between the intermediate ground and the reference ground. In preferred embodiments, the first area is a telephone network voltage (TNV) area, the second area is a secondary extra low voltage (SELV) area, the first capacitors are regular high voltage capacitors, and the second capacitor is a Y capacitor.

14 Claims, 2 Drawing Sheets

APPARATUS, SYSTEM, AND METHOD FOR EFFICIENT REDUCTION OF ELECTROMAGNETIC INTERFERENCE IN TELECOMMUNICATIONS EQUIPMENT

BACKGROUND OF THE INVENTION

1. Field of the Invention

The present invention relates, generally, to circuits for reducing electromagnetic interference (EMI) in telecommunications equipment, and, in preferred embodiments, to apparatus, systems, and processes for efficiently reducing EMI that is conducted along telecommunications lines using Y capacitors.

2. Description of Related Art

"Noise," defined herein as any type of undesirable signal that interferes with communication, is a problem increasingly important to telephony and other communication systems. In telephone lines, for example, the increased use of modems and facsimile machines to transmit data makes the reduction of noise an important aspect of telecommunication design.

One source of noise is electromagnetic interference (EMI). EMI is the undesired coupling of electromagnetic energy from an electromagnetic energy source to an affected circuit, system, or structure. EMI may be coupled from the source to the affected circuit, system, or structure through conduction along wires, by far field radiation from a transmitting antenna, through capacitive (electric field) coupling, and through inductive (magnetic field) coupling.

Telephones and other personal communications devices are often used in an environment that includes one or more nearby amplitude modulation (AM) broadcast radio stations or other types of wireless broadcasting systems having high power radio frequency transmitters and associated antenna systems, and are therefore subject to exposure to electromagnetic energy sufficient to interfere with or completely disable the operation of such a device. Interference to communications devices caused by such broadcasting systems results mainly from radiated radio frequency (RF) signals that are coupled into transmission lines and are then conducted as RF currents into communications devices connected to the affected transmission lines.

Because most present day communications devices employ active circuits (amplifiers, automatic gain control circuits, and the like) which provide certain advantages over older "passive" designs such as standalone telephones, they are more susceptible to interference caused by unwanted RF currents. This is due to the nature of the active circuitry, which has the undesired capability of readily demodulating audio from amplitude modulated RF carriers.

For example, AM interference with the desired operation of a telephone instrument occurs when the telephone's electronic circuits demodulate the audio signal component of amplitude modulated RF currents, amplify this unwanted audio signal component, and couple it to the telephone's receiver, thereby making it extremely difficult or effectively impossible to understand intended received speech. If the RF signal strength is high enough, the internal circuitry of the telephone instrument will be disabled, making it impossible to place a call.

This EMI problem is illustrated in FIG. 1, which shows a circuit equivalent of high powered, commercial, radio broadcast antenna transmitting RF signals into a two wire, metallic, telephone transmission line located in the vicinity of the antenna transmitter site. The unwanted AM broadcast signal is schematically represented by a noise source 10 having an associated noise source impedance 12. The AM signal is injected through a pair of resistors 14 and 16 representing a balanced two-wire transmission line 18 consisting of tip and ring lines 20 and 22 in a telephone set 24. The hardware of telephone set 24 typically includes a printed circuit board 26, housed within an insulating (plastic) housing or case 28. Mounted on printed circuit board 26 are one or more active electronic circuits, which are capacitively coupled to earth ground 30 by a naturally occurring mutual capacitance 32. The undesired RF currents are conducted over the two wire (tip and ring) transmission line 20 in common mode fashion. The strength of the RF noise signal, which follows the dotted line path 34 (from the source 10, through tip and ring transmission line 20, the amplifier circuitry of printed circuit board 26, and through mutual capacitance 34 to earth ground 30) is often high enough to cause interference to telephone instruments located around the perimeter of an AM radio broadcast facility.

Regulatory safety administrations require compliance with telephone equipment specifications by requiring galvanic insulation between the tip and ring telephone lines and the board or system. This insulation can be realized by transformers, capacitors, optocouplers, or the like. Although various shielding/grounding schemes, such as those described in the U.S. Patents to Pesola et al., U.S. Pat. No. 5,271,056 and Bogese, U.S. Pat. No. 4,738,638, address the EMI problem in general, neither patent describes the above-referenced problem of unwanted demodulation by the telephone's electronic circuitry of AM broadcast signals as undesired common mode RF currents on the two wire (tip and ring) conductors. The Pesola et al. patent describes the use of a ground foil with a raised edge of frame plate for components of a radio telephone. The Bogese patent describes the replacement of one of the conductors of a telephone type modular jack with a ground strap having a wide surface for conducting high frequency EMI signals to ground, or a metallic connector cover provided for the purpose.

U.S. Pat. No. 5,642,416 to Hill et al. discloses an electromagnetic interference bypass filtering mechanism that suppresses RF noise currents conducted over the tip and ring leads of a telephone line-powered telephone instrument that may be produced by AM radio broadcast signals emanating in the vicinity of the telephone instrument. The filtering mechanism comprises a conductive material coated on the interior surface of the housing of the telephone instrument, so as to surround the printed circuit board containing the telephone circuitry of the instrument, coupled to earth ground. First and second capacitors are coupled between the tip and ring leads and the conductive material, and first and second inductors are coupled in series with the tip and ring conductors and connections of the tip and ring conductors to the printed circuit board containing the telephone circuitry. Each of the first and second capacitors has a value that is larger than the value of mutual capacitance between conductive traces on printed circuit board and the conductive coating on the interior of the telephone's case. The effective impedance to earth ground seen by common mode RF noise current signals on the tip and ring leads is therefore lower than that encountered in a path through the circuitry on the printed circuit board. Although this effectively increases the common mode current injected into the telephone, the lower impedance of the by-pass path through the first and second capacitors steers the common mode RF current around the printed circuit board, rather than through its active circuitry.

However, when selecting filtering components such as the capacitors in the Hill et al. patent, safety requirements must be satisfied. In Nordic countries, for example, if capacitors are used, the capacitors must be certified to the IEC 384-14-1 standard. These certified capacitors must also be designed to meet certain safety and insulation requirements as defined by safety standard IEC 60950. For example, certified capacitors are designed such that in case of failure or fault they will blow open rather than into a shorted state. Example certification bodies that certify capacitors include TUV, SEMKO, NEMKO, DEMKO or FEMKO. The IEC standard uses different Y designations, such as Y1, Y2, Y3 and Y4, each representing a different voltage rating. Capacitors certified to the IEC standard are called "Y" capacitors.

Because these Y capacitors are certified, they must pass through more quality control steps, and thus they are generally more expensive. Another drawback to Y capacitors is that they are larger in size than regular high voltage capacitors. The larger size of the Y capacitors is due to a higher voltage rating than other capacitors, and a size requirement imposed by the certification standards. Thus, the two capacitor design of the Hill et al. patent, if implemented in a product governed by the IEC 384-14-1 standard, will be expensive and larger in size due to the requirement that the capacitors be Y capacitors.

Furthermore, in certain telephone applications, circuitry on printed circuit boards 26 such as PCI modem boards is divided into at least two separate areas, a Telephone Network Voltage (TNV) portion 36 and a Secondary or Safety Extra-Low Voltage (SELV) portion 38, as illustrated in FIG. 2. The TNV portion 36 of the circuit board 26 operates at standard telephone line voltages, and includes the tip and ring leads 20 and 22. The remainder of the circuit board 26 is generally the SELV portion 38, and includes PCI connectors and other circuitry carrying a maximum voltage level of 42 V peak to peak.

The SELV portion 38 of the PCI modem board 26 may contain low power standby circuitry for implementing a soft-start capability, which enables automatic activation and deactivation of a PC connected to the modem board based on the activation of a modem, alarm, or the like. A PC incorporating soft-start capability includes a power supply connected to an AC source and available for providing power. Control circuitry keeps the power supply, and thus the PC, turned off until an activation signal of some sort is received or asserted by detection circuitry in the SELV portion 38 of the PCI modem board 26, indicating a desire to activate the system. Upon receipt of the activation signal, the control circuitry turns on the power supply and the PC.

The detection circuitry in the SELV portion 38 of the PCI modem board 26 requires a constant power source to enable it to detect remote events. Conventionally, a low power SELV source provides "flea power" to the detection circuitry located on the secondary side of the power supply relative to the main power transformer. The SELV power source derives power directly from the AC source or from the relatively high DC input voltage from the primary side. The SELV power source also includes isolation circuitry, such as a transformer or the like, to transfer the power to the secondary side, and a regulation circuit for converting the power to a regulated low power signal, referred to as +5 VFP, which provides power to the detection circuit.

The TNV portion 36 of the circuit board 26 is separated from the SELV portion 38 by a safety barrier 40, which is comprised of a portion of the printed wiring board devoid of components, and which may include multiple ground planes and vias to act as a barrier against electromagnetic interference.

Safety standard IEC 60950 describes these TNV and SELV portions 36 and 38, and requires that these two portions be spanned using Y capacitors. Specifically, IEC 60950 requires galvanic insulation between line interfaces located in the TNV portion 36 of the circuit board, such as the tip and ring lines 20 and 22, and chassis ground 30 on the SELV portion 38 of the board or system, for filtering out EMI. This insulation can be realized by transformers, Y capacitors, or optocouplers. If Y capacitors are selected as the insulating devices, a minimum of two Y capacitors 42 and 44 are required—one from the tip line 20 to chassis ground 30 on the SELV portion 38 of the board 26, and one from the ring line 22 to chassis ground 30 on the SELV portion 38 of the board 26. As noted above, the use of two Y capacitors 42 and 44 is both expensive and space-consuming.

Furthermore, if improved line interface circuitry, impedance matching components, current regulation, and circuits which perform other functions such as caller ID are added to the TNV portion of the circuit board, some of which require a DC voltage and ground, an intermediate or analog ground 46 is needed in the TNV portion 36 of the circuit board 26. IEC 60950 requires that insulation be coupled between the intermediate ground 46 on the TNV portion 36 and chassis ground 30 on the SELV portion 38. If a Y capacitor 48 is used to provide this insulation, it adds further to the expense and consumption of space.

SUMMARY OF THE DISCLOSURE

Therefore, it is an advantage of embodiments of the present invention to provide an apparatus, system, and method for efficient reduction of electromagnetic interference in telecommunications equipment.

It is a further advantage of embodiments of the present invention to provide a an apparatus, system, and method for efficient reduction of electromagnetic interference in telecommunications equipment by reducing the number of Y capacitors needed for coupling between TNV and SELV portions of a circuit board.

These and other advantages are accomplished according to an apparatus for reducing electromagnetic interference on signals being communicated through the one or more communications conductors. The apparatus of the present invention is preferably situated in a communications circuit having a first area for receiving one or more communications conductors and an intermediate ground, and a second area having a reference ground. The apparatus includes one or more first capacitors, where each first capacitor is coupled between a communications conductor and the intermediate ground, and a second capacitor coupled between the intermediate ground and the reference ground. In preferred embodiments, the first area is a telephone network voltage (TNV) area, the second area is a secondary extra low voltage (SELV) area, the first capacitors are regular high voltage capacitors, and the second capacitor is a Y capacitor.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

Figure 1:
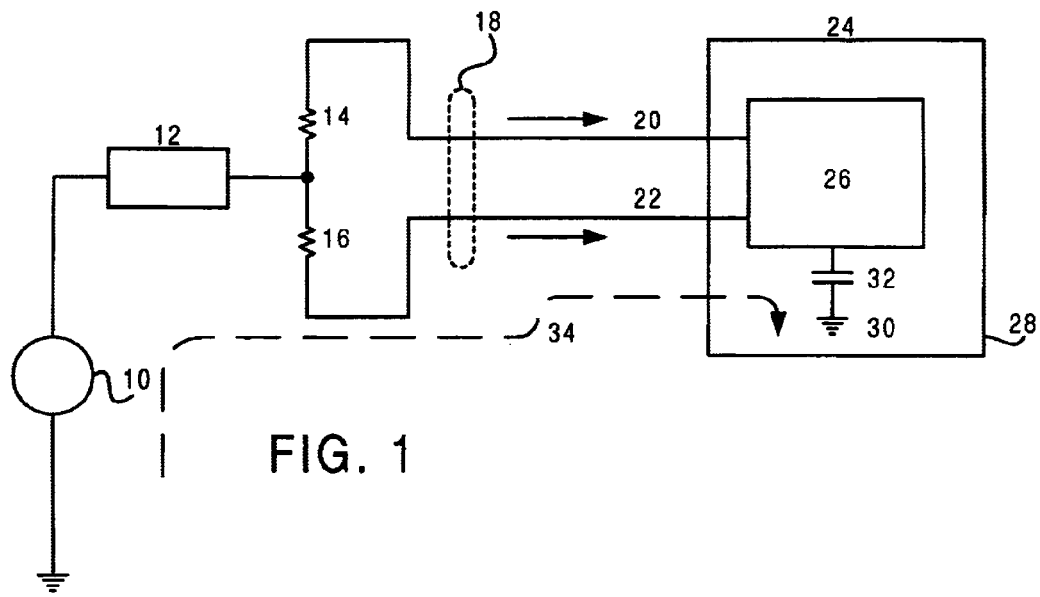
FIG. 1 illustrates an circuit equivalent of high powered, commercial, radio broadcast antenna transmitting RF signals into a two wire, metallic, telephone transmission line located in the vicinity of the antenna transmitter site.
Figure 2:
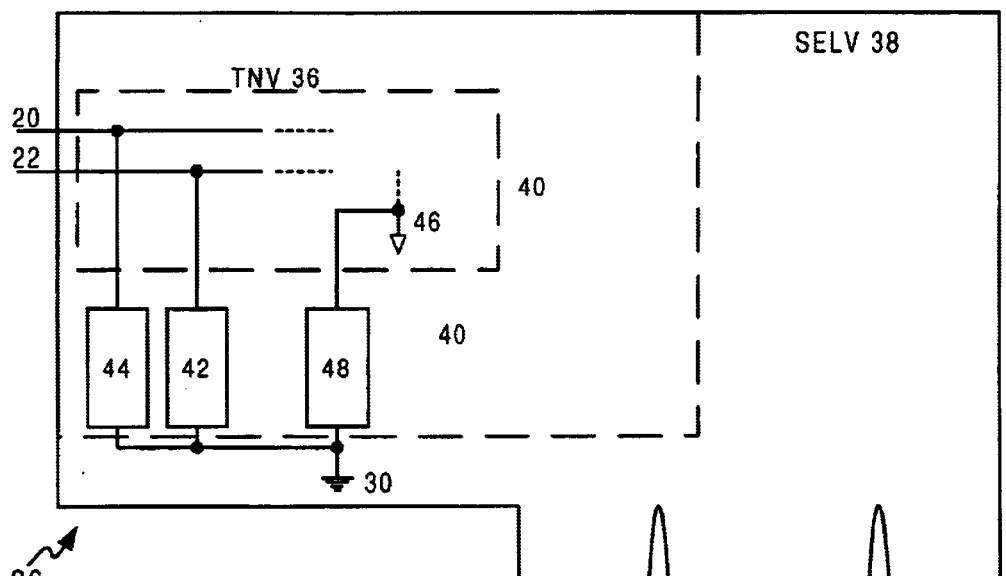
FIG. 2 illustrates a circuit board in a communications device having three EMI filtering Y capacitors, one coupled between a tip line of the TNV portion and chassis ground in the SELV portion, one coupled between a ring line of the TNV portion and chassis ground in the SELV portion, and one coupled between an analog ground of the TNV portion and a chassis ground in the SELV portion.

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

In some communication devices, circuitry on printed circuit boards such as PCI modem boards is divided into at least two separate areas, the TNV portion and the SELV portion. The TNV portion of the circuit board operates at standard telephone line voltages, and includes the tip and ring leads. The remainder of the circuit board is generally the SELV portion, and includes PCI connectors and other circuitry. The TNV portion of the circuit board is separated from the SELV portion by a safety barrier, which is comprised of a portion of the printed wiring board devoid of components, and which may include multiple ground planes and vias to act as a barrier against electromagnetic interference.

Safety standard IEC 60950 describes these TNV and SELV portions, and requires that these two portions be spanned using Y capacitors. Specifically, IEC 60950 requires galvanic insulation between line interfaces located in the TNV portion of the circuit board, such as the tip and ring lines, and chassis ground on the SELV portion of the board or system, for filtering out EMI. This insulation can be realized by transformers, Y capacitors, or optocouplers. If Y capacitors are selected as the insulating devices, a minimum of two Y capacitors are required—one from the tip line to a reference ground on the SELV portion of the board, and one from the ring line to the reference ground on the SELV portion of the board. As noted above, the use of two Y capacitors is both expensive and space-consuming.

Furthermore, as improvements in the field have resulted in the addition of line interface circuitry, impedance matching components, current regulation, and circuits which perform other functions such as caller ID to the TNV portion of the circuit board, some of which require connections to a DC voltage and ground, an intermediate or analog ground was needed in the TNV portion of the circuit board. IEC 60950 requires that insulation be located between the intermediate ground on the TNV portion of the board and chassis ground on the SELV portion. If a Y capacitor is used to provide this insulation, it adds further to the expense and consumption of space.

Thus, for communication devices employing circuit boards having TNV and SELV portions, with tip and ring lines and an analog ground in the TNV portion, and a chassis ground in the SELV portion, a total of three Y capacitors may be required: one between the tip line and chassis ground, one between the ring line and chassis ground, and one between the analog ground and chassis ground.

Embodiments of the present invention eliminate two of the three Y capacitors, and replace them with regular high voltage capacitors. Specifically, the Y capacitors between the tip and ring lines and chassis ground are replaced with capacitors between the tip and ring lines and analog ground. Because the leads of the capacitors between the tip and ring lines and analog ground are located within the TNV area, Y capacitors are not necessary and regular high voltage capacitors can be used. These regular high voltage capacitors are not certified and are therefore less expensive and also smaller than the Y capacitors. The Y capacitor located between the analog ground and chassis ground remains unchanged.

Figure 3:
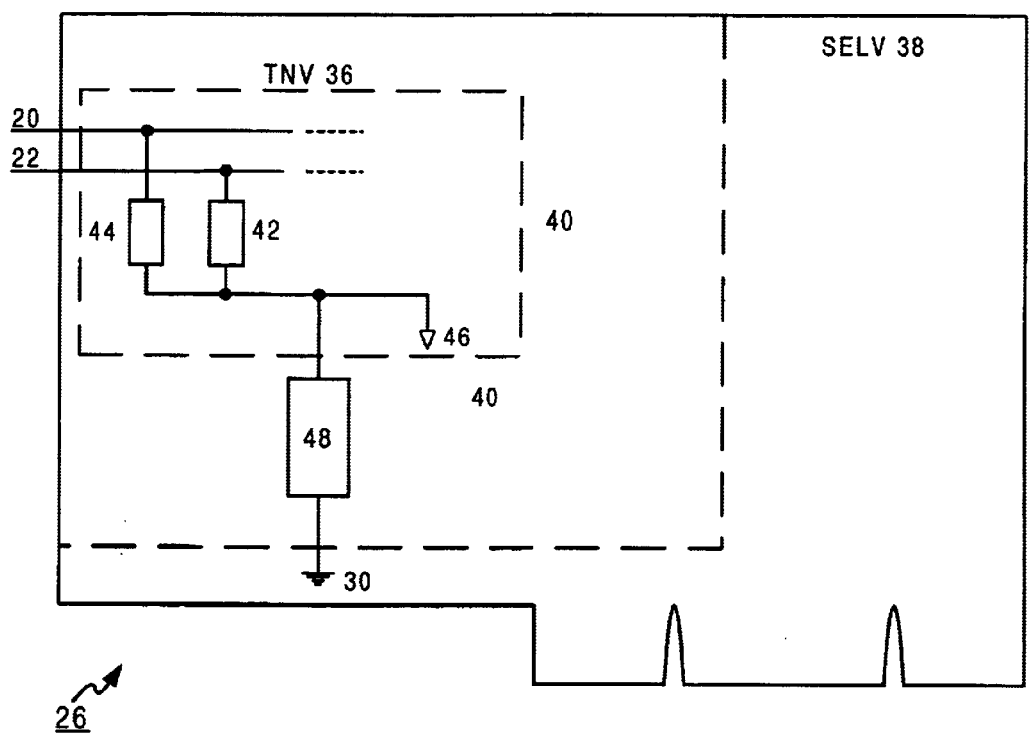
FIG. 3 illustrates a circuit board in a communications device having two EMI filtering regular high voltage capacitors, one coupled between a tip line and analog ground in a first area of the circuit board and one coupled between a ring line and the analog ground, and one EMI filtering Y capacitor coupled between analog ground in the first area and chassis ground in a second area, according to an embodiment of the present invention.

An embodiment of the present invention is illustrated in FIG. 3, wherein circuitry on a circuit board 26 is divided into first and second areas 36 and 38. The two areas 36 and 38 are separated by a safety barrier 40, which is a portion of the printed wiring board with little or no components, and which may include multiple ground planes and vias to act as a barrier against electromagnetic interference. Communication lines 20 and 22 are connected to circuitry in the first area 36. In preferred embodiments, the circuit board 26 is a communications device such as PCI modem board, and the areas 36 and 38 include a TNV portion 36 and an SELV portion 38. In further preferred embodiments, the communication lines are tip and ring leads 20 and 22.

Capacitors 42 and 44 are coupled between communication lines 20 and 22 and analog ground 46. In preferred embodiments, capacitors 42 and 44 are regular high voltage capacitors. Capacitor 48 is coupled between analog ground 46 and chassis ground 30 on the second area 38. In preferred embodiments, capacitor 48 is a Y capacitor. In preferred embodiments, the respective values of capacitors 42 and 44 are larger than the mutual capacitance between conductive traces on the first area 36 of circuit board 26 and analog ground 46. As a result, the effective impedance to analog ground 46 seen by the common mode RF noise current signals on communication lines 20 and 22 is lower than that encountered in a path through the circuitry on the first area 36 of circuit board 26.

Although the capacitor by-pass arrangement of the present invention may increase the common mode current injected into the telephone, the lower impedance of the by-pass path through capacitors 42 and 44 serves to direct the common mode RF current around the first area 36 of circuit board 26, and through capacitor 48 to chassis ground 30, rather than through an undesired path that includes active circuitry on the first area 36 of circuit board 26. However, in telephone embodiments of the present invention, the values of capacitors 42 and 44 must be sufficiently small to prevent reduction of the AC impedance that the telephone presents to the telephone network when it is off hook.

Therefore, embodiments of the present invention generally provide an apparatus, system, and method for efficient reduction of electromagnetic interference in telecommunications equipment. Specifically, embodiments of the present invention provide a an apparatus, system, and method for efficient reduction of electromagnetic interference in telecommunications equipment by reducing the number of Y capacitors needed for coupling between TNV and SELV portions of a circuit board.

What is claimed is:

1. A system for reducing electromagnetic interference in communications circuits, comprising:

a first circuit area for receiving one or more communications conductors, wherein said first circuit area has an intermediate ground;

a second circuit area having a reference ground, wherein said second circuit area is galvanically isolated from said first circuit area;

one or more first capacitors, wherein at least one of said one or more first capacitors is coupled between one of said one or more communications conductors and said intermediate ground; and a second capacitor coupled between the intermediate ground and the reference ground.

2. The system recited in claim 1, the one or more first capacitors comprising non-certified capacitors and the second capacitor comprising a certified capacitor.

3. The system recited in claim 2, the second capacitor comprising a Y capacitor.

4. The system recited in claim 1, wherein the values of the one or more first capacitors are larger than the mutual capacitance between conductive traces on the first circuit area and the intermediate ground.

5. The system recited in claim 1, the first circuit area comprising a telephone network voltage (TNV) circuit area the second circuit area comprising a secondary extra low voltage (SELV) circuit area.

6. The system recited in claim 1, the one or more communications conductors comprising tip and ring lines.

7. In a communications circuit having a first circuit area for receiving one or more communications conductors, wherein said first circuit area has an intermediate ground, and a second circuit area having a reference ground, wherein said second circuit area is galvanically isolated from said first circuit area, an apparatus for reducing electromagnetic interference on signals being communicated through the one or more communications conductors, the apparatus comprising:

one or more first capacitors, each first capacitor coupled between a communications conductor and the intermediate ground; and a second capacitor coupled between the intermediate ground and the reference ground.

8. The apparatus recited in claim 7, the one or more first capacitors comprising non-certified capacitors and the second capacitor comprising a certified capacitor.

9. The apparatus recited in claim 8, the second capacitor comprising a Y capacitor.

10. The apparatus recited in claim 7, wherein the values of the one or more first capacitors are larger than the mutual capacitance between conductive traces on the first circuit area and the intermediate ground.

11. In a communications circuit having a first circuit area for receiving one or more communications conductors, wherein said first circuit has an intermediate ground, and a second circuit area having a reference ground, wherein said second circuit area is galvanically isolated from said first circuit area, a method for reducing electromagnetic interference on signals being communicated through the one or more communications conductors, the method comprising:

coupling a first capacitor between each communications conductor and the intermediate ground; and coupling a second capacitor between the intermediate ground and the reference ground.

12. The method recited in claim 11, wherein:

the coupling a first capacitor between each communications conductor and the intermediate ground comprises coupling a non-certified capacitor between each communications conductor and the intermediate ground; and the coupling a second capacitor between the intermediate ground and the reference ground comprises coupling a certified capacitor between the intermediate ground and the reference ground.

13. The method recited in claim 12, wherein said coupling a certified capacitor between the intermediate ground and the reference ground comprising coupling a Y capacitor between the intermediate ground and the reference ground.

14. The method recited in claim 11, further comprising selecting the values of the first capacitors to be larger than the mutual capacitance between conductive traces on the first circuit area and the intermediate ground.

* * * * *